United States Patent [19]

Nakamura

[11] Patent Number: 4,945,025

[45] Date of Patent: * Jul. 31, 1990

[54] LIGHT-SENSITIVE MATERIAL CONTAINING SILVER HALIDE, REDUCING AGENT AND POLYMERIZABLE COMPOUND WHEREIN THE LIGHT-SENSITIVE LAYER IS PROVIDED WITH A COVER SHEET

[75] Inventor: Koichi Nakamura, Minami-Ashigara, Japan

[73] Assignee: Fuji Photo Film Co., Ltd., Kanagawa, Japan

[ * ] Notice: The portion of the term of this patent subsequent to May 23, 2006 has been disclaimed.

[21] Appl. No.: 24,481

[22] Filed: Mar. 11, 1987

[30] Foreign Application Priority Data

Mar. 11, 1986 [JP] Japan ................................. 61-55507

[51] Int. Cl.$^5$ .......................... G03C 1/68; G03C 1/72
[52] U.S. Cl. .................................. 430/138; 430/523; 430/533; 430/535; 430/270; 430/281; 430/961
[58] Field of Search ............. 430/523, 524, 533, 535, 430/138, 270, 281, 292, 273, 961, 264

[56] References Cited

U.S. PATENT DOCUMENTS

| | | | |
|---|---|---|---|
| 3,694,252 | 9/1972 | Gerber et al. | 430/138 |
| 3,694,253 | 9/1972 | Gerber et al. | 430/138 |
| 3,933,508 | 1/1976 | Ohkubo et al. | 430/523 |
| 4,283,486 | 8/1981 | Aono et al. | 430/961 |
| 4,629,676 | 12/1986 | Hayakawa et al. | 430/325 |
| 4,649,098 | 3/1987 | Takeda | 430/270 |
| 4,833,062 | 5/1989 | Kakimi | 430/138 |

FOREIGN PATENT DOCUMENTS 0203613  12/1986  European Pat. Off. ............ 430/138

Primary Examiner—Paul R. Michl
Assistant Examiner—Patrick A. Doody
Attorney, Agent, or Firm—Sughrue, Mion, Zinn, MacPeak & Seas

[57] ABSTRACT

A light-sensitive material comprising a light-sensitive layer which contains silver halide, a reducing agent and a polymerizable compound and support, wherin the light-sensitive layer is provided thereon with a cover sheet. A light-sensitive material comprising the light-sensitive layer and a support, wherein the light-sensitive layer is provided thereon with a protective layer is also disclosed.

18 Claims, No Drawings

LIGHT-SENSITIVE MATERIAL CONTAINING SILVER HALIDE, REDUCING AGENT AND POLYMERIZABLE COMPOUND WHEREIN THE LIGHT-SENSITIVE LAYER IS PROVIDED WITH A COVER SHEET

BACKGROUND OF THE INVENTION

1. Field of the Invention

This invention relates to a light-sensitive material comprising a light-sensitive layer containing silver halide, a reducing agent and a polymerizable compound provided on a support, and image-forming methods employing the light-sensitive material.

2. Description of the Prior Arts

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Japanese Patent Provisional Publication No. 61(1986)-260241 (corresponding to U.S. Pat. Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polymerizable compound in the other portion is polymerized.

The light-sensitive material employed in the above-mentioned image-forming methods should be handled with scrupulous care in the preparation, the transference or the image formation thereof, because the polymerizable compound in the material generally is in a liquid state or a non-solid state, and the polymerizable compound is sometimes contained in microcapsules which are dispersed in the light-sensitive layer. Further, the light-sensitive material should be carefully preserved after the preparation, because the reducing agent in the material generally is not a stable compound, and the polymerizable compound tends to solidify when it is dried or oxidized.

SUMMARY OF THE INVENTION

An object of the present invention is to provide a light-sensitive material which is easy to handle and is improved in preservability.

Another object of the invention is to provide a light-sensitive material which gives a clear image.

There is provided by the present invention a light-sensitive material comprising a light-sensitive layer which contains silver halide, a reducing agent and a polymerizable compound and support, wherein the light-sensitive layer is provided thereon with a cover sheet.

There is also provided by the invention a light-sensitive material comprising the light-sensitive layer which contains silver halide, a reducing agent and a polymerizable compound and a support, wherein the light-sensitive layer is provided thereon with a protective layer.

The light-sensitive material of the invention is characterized in the cover sheet or the protective layer provided on the light-sensitive layer.

The light-sensitive material on which the cover sheet or the protective layer is provided is substantially free from breakage of the light-sensitive layer in the handling of the material. Therefore, the light-sensitive material of the invention can be easy to handle in the preparation, the transference or the image formation thereof.

Further, in the light-sensitive material of the invention, the components of the light-sensitive layer, such as the reducing agent, the polymerizable compound, are not directly exposed to oxygen and moisture in the air which cause the deterioration of the components. Therefore, the light-sensitive material of the invention can give a clear image, even if the material is preserved for a long term.

Furthermore, in the case that a heat development process is utilized for developing the light-sensitive material, the supply of oxygen into the light-sensitive layer from outside can be restricted to improve the sensitivity of the light-sensitive material.

DETAILED DESCRIPTION OF THE INVENTION

In the light-sensitive material of the invention, a cover sheet or a protective layer is provided on the light-sensitive layer. In this specification, a sheet (or layer) molded prior to the attachment to the light-sensitive layer is referred to as the cover sheet, and a layer (or sheet) formed on the light-sensitive layer by coating or lamination is referred to as the protective layer.

Examples of the low material of the cover sheet include a polymer, metal (e.g., iron, nickel, chromium, copper, aluminum, titanium and an alloy of these metals) and glass. Among them, a transparent material, such as a polymer and glass is preferred, because the light-sensitive material can be imagewise exposed to light without removing the transparent cover sheet.

In the case that a heat development process is utilized for developing the light-sensitive material, the cover sheet preferably is an oxygen-impermeable sheet.

The present inventor has found that when supply of oxygen into the light-sensitive layer from outside is restricted in the heat development process, the sensitivity of the light-sensitive layer for development is enhanced.

It has been observed that in the heat development process of the above-mentioned image-forming method, the sensitivity for development is lowered by influence of oxygen in the air, because oxygen functions as a polymerization inhibitor and thereby the polymerization reaction of the polymerizable compound is retarded. In contrast, in a light-sensitive material on which the oxygen-impermeable sheet is provided, the polymerization reaction within the area where the latent image of the silver halide has been formed (or the area where the latent image of the silver halide has not been formed) smoothly proceeds to give an image of high quality or to give an image within a short period of time, because supply of oxygen into the light-sensitive layer from outside is restricted.

Further, among the low materials of the cover sheet, the polymer is most convenient to handle because of the light weight. Both of a plastic polymer and a nonplastic polymer, such as a fluororesin (e.g., Teflon, trademark), can be employed. Furthermore, the plastic polymer is most preferred, because it is inexpensive and easy to mold to prepare the cover sheet.

Examples of the polymer include polyethylene, polypropylene, polystyrene, polyvinyl acetate, polyvinyl butyral, polyvinyl acetal, polyvinyl fluoride, polyvinyl pyrrolidone, polyvinyl chloride, polyethyl acrylate, polymethyl methacrylate, polyethyl methacrylate, polyvinylidene chloride, chlorinated polyethylene, chlorinated polypropylene, polycarbonate, polybutadiene, cellulose acetate, cellulose acetate butylate, cellulose acetate propionate, ethyl cellulose, benzyl cellulose, cellulose acetate phthalate, polyethylene terephthalate, polyacrylonitrile, acrylonitrile/styrene copolymer, polymethacrylonitrile, methacrylonitrile/styrene copolymer, polyvinyl alcohol, polyvinyl imidazole, polyacrylamide, vinylalcohol/ethylene copolymer and gelatin.

The thickness of the cover sheet can be determined according to the protective function, the light transmittance, the transmission coefficient of oxygen and the handling. For example, a thick sheet is preferred with respect to the protective function, but a thin sheet (e.g., not more than 0.2 mm) is preferred with respect to the handling. The cover sheet preferably has a thickness of from 1 μm to 1 mm, and more preferably from 10 μm to 0.2 mm.

In the case that an oxygen-impermeable sheet is employed as the cover sheet to improve the sensitivity of the light-sensitive material, a relatively thin sheet can be employed when the sheet is made of a polymer having a transmission coefficient of oxygen of not more than $1.0 \times 10^{-11}$ cm$^3$·cm/cm$^2$·sec·cmHg.

The transmission coefficient of oxygen follows the definition described in J. Brandrup, editted by E. H. Immergut, "Polymer Handbook", (1975, III-229). The above value of the transmission coefficient of oxygen substantially corresponds to not more than about $5 \times 10^{-10}$ cm$^2$/sec determined according to the definition described in K. Petrak, Journal of Applied Polymer Science, Vol. 23, 2365 (1979).

Examples of the above polymer include polyacrylonitrile, acrylonitrile/styrene copolymer, polymethacrylonitrile, methacrylonitrile/styrene copolymer, polyvinyl acetate, polyvinyl alcohol, polyvinyl chloride, polyvinylidene chloride, polyvinyl imidazole, vinylidene chloride/acrylonitrile copolymer, polyacrylamide, vinyl alcohol/ethylene copolymer (tradename "Eval" produced by Kuraray Co., Ltd.) and gelatin.

These polymers are described in the above Polymer Handbook and Journal of Applied Polymer Science.

The above-mentioned cover sheet can be prepared by molding a commercially available sheet for the light-sensitive material. The cover sheet can be also made from the low material according to literatures.

The protective layer in the light-sensitive material of the invention preferably is a layer containing a polymer. The polymer which may be employed in the above-mentioned cover sheet is also employable in the protective layer.

The protective layer preferably is transparent to imagewise expose the light-sensitive material without removing the protective layer. Further, in the case that a heat development process is utilized for developing the light-sensitive material, the protective layer preferably contains the above mentioned polymer having a transmission coefficient of oxygen of not more than $1.0 \times 10^{-11}$ cm$^3$·cm/cm$^2$·sec·cmHg.

Furthermore, in the case that an unpolymerized polymerizable compound and/or a color image forming substance is transferred from the light-sensitive material to an image-receiving material, the protective layer preferably is a porous layer. Alternatively, when a thick protective layer is employed, the unpolymerized polymerizable compound is transferred to the image-receiving material preferably after the protective layer is removed from the light-sensitive material. Further, the unpolymerized polymerizable compound can be transferred while heating the light-sensitive material and the image-receiving material to improve the transference of the image.

The protective layer can contain a matting agent. Various compounds including a known compounds in the conventional art of photography can be employed as the matting agent. The matting agent generally means a discontinuous solid particle made of inorganic or organic material which can be dispersed in a hydrophilic organic colloidal binder.

Examples of the inorganic matting agent include an oxidant (e.g., silicon dioxide, titanium dioxide, magnesium oxide, aluminum oxide), a salt of alkali earth metal, such as sulfate, carbonate (e.g., barium sulfate, calcium sulfate, magnesium sulfate, calcium carbonate), silver halide which does not participate in the image formation (e.g., silver chloride, silver bromide, in which a slight amount of silver iodide may be contained) and glass.

Examples of the organic matting agent include starch, cellulose ester (e.g., cellulose acetate propionate), cellulose ether (e.g., ethyl cellulose) and a synthetic resin which preferably is in the form of a dispersion of a water-insoluble or slightly water-soluble polymer. Examples of the synthetic resin include alkyl acrylate, alkyl methacrylate, alkoxyalkyl acrylate, alkoxyalkyl methacrylate, glycidyl acrylate, glycidyl methacrylate, acrylamide, methacrylamide, vinyl ester (e.g., vinyl acetate), acrylonitrile, an olefin hydrocarbon, styrene, a mixture of these polymers and a copolymer comprising a repeating unit derived from one of these polymers and another repeating unit derived from a compound, such as acrylic acid, methacylic acid, $\alpha,\beta$-unsaturated dicarboxylic acid, hydroxyalkyl (meth)acrylate, sulfoalkyl (meth)acrylate, stylenesulfonic acid. Among them, polymethyl methacrylate is most preferred.

The matting agent preferably has a mean particle size of from about 0.1 to about 10 $\mu$m, and more preferably from 0.5 to 8 $\mu$m, and most preferably from 1 to 6 $\mu$m.

The protective layer preferably has a thickness of from 0.1 $\mu$m to 50 $\mu$m, and more preferably from 0.1 to 5 $\mu$m.

The protective layer can be formed by dissolving, emulsifying or dispersing the components, such as the binder in an adequate medium to obtain a coating solution, and then coating the obtained coating solution on the light-sensitive layer. Alternatively, the protective layer can be also formed on the light-sensitive layer according to a known method for lamination. In the case that the protective layer is prepared as a porous layer, the coating solution preferably is in the form of a latex in which a polymer is dispersed in a medium.

The silver halide, the reducing agent, the polymerizable compound and the support which constitute the light-sensitive material of the invention are described below. Thus composed material is referred hereinafter to as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (Jun. 1978), and Research Disclosure No. 17643, 22-31 (Dec. 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)- hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)car-bamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compounds employable for the light-sensitive material are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

The oil droplets of the polymerizable compound are preferably prepared in the form of microcapsules. There is no specific limitation on preparation of the microcapsules. There is also no specific limitation on shell material of the microcapsule, and various known materials such as polymers which are employed in conventional microcapsules can be employed as the shell material. The mean size of the microcapsule preferably ranges from 0.5 to 50 μm, more preferably 1 to 25 μm, most preferably 3 to 20 μm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", 26–32 (Jun. 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26-28 (Dec. 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (Jun. 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid compositions containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive layer can be formed by coating and drying the above-prepared coating solution on a support in the conventional manner.

The light-sensitive material of the invention is prepared by providing a cover sheet or a protective layer on the light-sensitive layer.

An under coating layer can be formed on the light-sensitive layer prior to the attachment of the cover sheet to enhance the adhesion between the light-sensitive layer and the cover sheet. Further, the surface of the cover sheet can be processed with a physical or chemical treatment to enhance the adhesion.

The protective layer can be formed by coating or lamination as mentioned above.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

The light-sensitive material can be imagewise exposed after the cover sheet (especially in the case that the cover sheet is not transparent) is removed.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Application No. 61(1986)-243449 (corresponding to U.S. patent Ser. No. 854,640).

In the case that the cover sheet or the protective layer is an oxygen-impermeable sheet or layer, the supply of oxygen into the light-sensitive layer can be restricted in the heat development process to improve the sensitivity, as mentioned above.

In the above development process, a polymer image can be formed on the light-sensitive layer. A pigment image can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule. In the cover sheet or the protective layer is an oxygen-impermeable sheet or layer, the sheet or layer can function of protecting the obtained image after the image-formation. The present inventor has found that the discoloration of the obtained color image is caused by deterioration of the developed color former, and that the deterioration is a photochemical reaction in presence of oxygen. Therefore, the color of the image formed on the light-sensitive layer can be protected by the oxygen-impermeable sheet or layer.

The image can be also formed on the image-receiving material. The image-receiving material is described hereinbelow. The image forming method employing the image-receiving material or the image-receiving layer is described in Japanese Patent Provisional Publication No. 61(1986)-278849 (corresponding to U.S. patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer.

The image-receiving layer can be composed of two or more layers according to the above-mentioned functions. The thickness of the image-receiving layer preferably ranges from 1 to 100 $\mu$m, more preferably from 1 to 20 $\mu$m.

After the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

COMPARISON EXAMPLE 1

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 $\mu$m and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. Excess salts were sedimented and removed from the resulting emulsion by pH adjustment. Thereafter, the emulsion was adjusted to a pH of 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (tradename of Ciba-Geigy) and 2 g of Emulex NP-8 (tradename, produced by Nippon Emulsion Co., Ltd.).

(Copolymer)

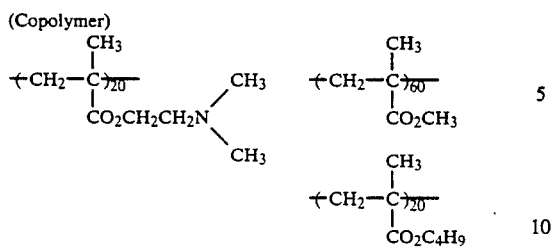

In 18.00 g of the resulting solution was dissolved 0.002 g of the following thiol derivative.

(Thiol derivative)

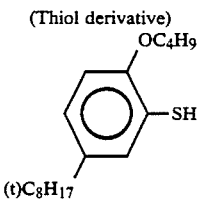

To the resulting solution was added a solution in which 0.16 g of the following reducing agent (I) and 1.22 g of the following reducing agent (II) are dissolved in 1.80 g of methylene chloride.

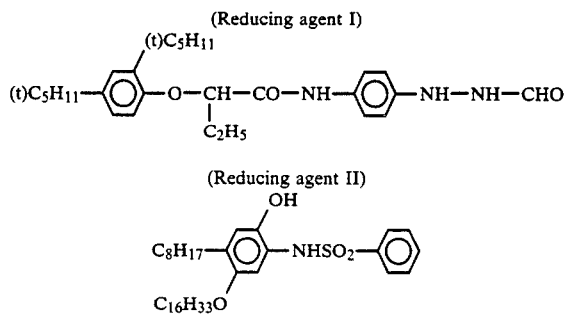

Further, to the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

(Anionic surfactant)

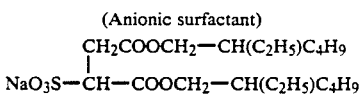

The coating solution was uniformly coated on a polyethylene terephthalate film (thickness: 100 μm) using a coating rod of #40 to give a layer having a wet thickness of 70 μm and dried at about 40° C. to obtain a light-sensitive material (A).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on an art paper having a basis weight of 43 g/m² to give a layer having a wet thickness of 30 μm and dried to obtain an image-receiving material.

Evaluation of light-sensitive material

The light-sensitive material (A) was imagewise exposed to light using a tungsten lamp at 200 lux for 1 second and then heated on a hot plate at 125° C. for 40 seconds. The exposed and heated light-sensitive material was then combined with the image-receiving material and passed through press rolls under pressure of 350 kg/cm² to obtain a magenta positive image on the image receiving material. The density of the obtained image was measured using Macbeth reflection densitometer. Each of the maximum density and the minimum density respectively was 1.41 and 0.20. Further, the sensitivity of the obtained image was supposed to have a relative value of 100 to determine the relative sensitivity.

EXAMPLE 1

Preparation of light-sensitive material

The light-sensitive material (B) was prepared by attaching a polyethylene terephthalate film (thickness: 100 μm) on the light-sensitive layer of the light-sensitive material (A) prepared in Comparison Example 1.

Evaluation of light-sensitive material

The light-sensitive material (B) was imagewise exposed to light using a tungsten lamp at 200 lux for 1 second and then heated on a hot plate at 125° C. for 40 seconds. In these processes, the light-sensitive material was easily handled, because the cover sheet (polyethylene terephthalate film) was attached on the light-sensitive layer. After the cover sheet was removed, the exposed and heated light-sensitive material was then combined with the image-receiving material and passed through press rolls under pressure of 350 kg/cm² to obtain a clear magenta positive image on the image receiving material. The density of the obtained image was measured using Macbeth reflection densitometer. Each of the maximum density and the minimum density was the same as in Comparison Example 1. However, the relative sensitivity of the obtained image increased to 350.

COMPARISON EXAMPLE 2

Preparation of silver halide emulsion

In 3 l of water were dissolved 40 g of gelatin and 23.8 g of potassium bromide and the resulting gelatin solution was kept at 50° C. To the gelatin solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 g.

Preparation of light-sensitive composition

In 100 g of trimethylolpropane triacrylate were dissolved 0.40 g of the copolymer used in Comparison Example 1 and 6.00 g of Pargascript Red I-6-B (tradename of Ciba-Geigy). In 18.00 g of the obtained solution was added a solution in which 0.16 g of the reducing agent (I) and 1.22 g of the reducing agent (II) both used in Comparison Example 1 are dissolved in 1.80 g of methylene chloride. Further, to the resulting solution was added a mixture which is prepared by mixing 4.06 g of the above silver halide emulsion and 0.6 ml of a 0.04% methanol solution of following dye and stirred for 5 minutes, and the resulting mixture was stirred at 15,000 r.p.m. for 5 min. to obtain a light-sensitive composition.

(Dye)

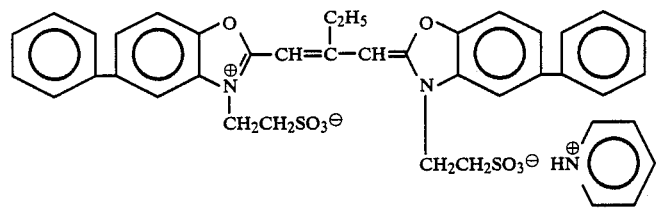

Preparation of light-sensitive microcapsule

Dispersion of light-sensitive microcapsule was prepared in the same manner as in Comparison Example 1 except that the above light-sensitive composition was used.

Preparation of light-sensitive material

A light-sensitive material (C) was prepared in the same manner as in Comparison Example 1 except that the above light-sensitive microcapsule was used.

Evaluation of light-sensitive material

The light-sensitive material (C) was imagewise exposed to light through a green filter which transmits a light having a wavelength from 500 to 600 nm and in which the density continuously changed, using a tungsten lamp at 2,000 lux for 1 second and then heated on a hot plate at 125° C. for 20 seconds. The exposed and heated light-sensitive materials was then combined with the image-receiving material and passed through press rolls under pressure of 350 kg/cm² to obtain a magenta positive image on the image receiving element. The density of the obtained image was measured using Macbeth reflection densitometer. Each of the maximum density and the minimum density respectively was 1.41 and 0.19. Further, the sensitivity of the obtained image was supposed to have a relative value of 100 to determine the relative sensitivity.

EXAMPLE 2

Preparation of light-sensitive material

The light-sensitive material (D) was prepared by coating 3% aqueous solution of polyvinyl alcohol (degree of polymerization: 2,000) on the light-sensitive layer of the light-sensitive material (C) prepared in Comparison Example 2 to give a layer having a wet thickness of 3 μm and drying the obtained layer.

Evaluation of light-sensitive material

The light-sensitive material (D) was imagewise exposed to light through a green filter which transmits a light having a wavelength from 500 to 600 nm and in which the density continuously changed, using a tungsten lamp at 2,000 lux for 1 second and then heated on a hot plate at 125° C. for 20 seconds. The exposed and heated light-sensitive materials was then combined with the image-receiving material and passed through press rolls under pressure of 500 kg/cm² to obtain a clear magenta positive image on the image receiving element. The density of the obtained image was measured using Macbeth reflection densitometer. Each of the maximum density and the minimum density respectively was 1.15 and 0.20. The relative sensitivity of the obtained image increased to 350. In these process, the light-sensitive material was easily handled, because the protective layer was provided on the light-sensitive layer.

EXAMPLE 3

Preparation of light-sensitive material

The light-sensitive material (E) was prepared by coating 3% aqueous solution of polyvinyl alcohol (degree of polymerization: 2,000) on the light-sensitive layer of the light-sensitive material (C) prepared in Comparison Example 2 and drying the material to obtain a protective layer having a dry thickness of 50 μm.

Evaluation of light-sensitive material

The light-sensitive material (E) was imagewise exposed to light through a green filter which transmits a light having a wavelength from 500 to 600 nm and in which the density continuously changed, using a tungsten lamp at 2,000 lux for 1 second and then heated on a hot plate at 125° C. for 20 seconds. In these process, the light-sensitive material was easily handled, because the protective layer was provided on the light-sensitive layer. After the protective layer was removed, the exposed and heated light-sensitive material was then combined with the image-receiving material and passed through press rolls under pressure of 350 kg/cm² to obtain a clear magenta positive image on the image receiving element. The density of the obtained image was measured using Macbeth reflection densitometer. Each of the maximum density and the minimum density was the same as in Comparison Example 2. However, the relative sensitivity of the obtained image increased to 350.

COMPARISON EXAMPLE 3

Preparation of solution of color developer

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform to prepare a solution of a color developer.

Preparation of light-sensitive material

To a mixture of 5.0 g of the light-sensitive microcapsule dispersion prepared in Comparison Example 2 and 5.0 g of the solution of a color developer were added 1.0 g of 1% aqueous solution of the anionic surfactant used in Comparison Example 1 and 1.0 g of 10% solution (solvent: water/ethanol=50/50 as volume ratio) of guanidine trichroloacetate to prepare a coating solution. The coating solution was uniformly coated on a polyethylene terephthalate film (thickness: 100 μm) using a coating rod of #40 to give a layer having a wet thickness of 70 μm and dried at about 40° C. to obtain a light-sensitive material (F).

Evaluation of light-sensitive material

The light-sensitive material (F) was imagewise exposed to light using a tungsten lamp at 2,000 lux for 1 second and then heated on a hot plate at 125° C. for 40 seconds. The exposed and heated light-sensitive material was then passed through press rolls under pressure of 350 kg/cm² to obtain a magenta positive image on the light-sensitive material. The density of the obtained image was measured using Macbeth reflection densitometer. Each of the maximum density and the minimum density respectively was 0.70 and 0.25. Further, the sensitivity of the obtained image was supposed to have a relative value of 100 to determine the relative sensitivity.

EXAMPLE 4

Preparation of light-sensitive material

The light-sensitive material (G) was prepared by coating 3% aqueous solution of polyvinyl alcohol (degree of polymerization: 2,000) on the light-sensitive layer of the light-sensitive material (F) prepared in Comparison Example 3 and drying the material to obtain a protective layer having a dry thickness of 10 μm.

Evaluation of light-sensitive material

The light-sensitive material (G) was evaluated in the same manner as in Comparison Example 3. Each of the maximum density and the minimum density was the same as in Comparison Example 3. However, the relative sensitivity of the obtained image increased to 300.

Further, the same result was obtained in the light-sensitive material having a thicker protective layer than the above layer. It is apparent from the results that a clear image can be formed on the light-sensitive material having a protective layer with high sensitivity and without disturbing the image formation.

I claim:

1. A light-sensitive material comprising a support and a light-sensitive layer containing silver halide, a reducing agent, an ethylenically unsaturated polymerizable compound, said silver halide and said ethylenically unsaturated compound being contained in microcapsules which are dispersed in the light-sensitive layer, and said ethylenic unsaturated compound being contained in microcapsules in an amount of 5 to $1.2 \times 10^5$ times by weight as much as the amount of the silver halide, wherein the light-sensitive layer is provided thereon with a cover sheet.

2. The light-sensitive material as claimed in claim 1, wherein the cover sheet is a transparent sheet.

3. The light-sensitive material as claimed in claim 1, wherein the cover sheet is an oxygen-impermeable sheet.

4. The light-sensitive material as claimed in claim 1, wherein the cover sheet has thickness of from 1 μm to 1 mm.

5. The light-sensitive material as claimed in claim 1, wherein the light-sensitive layer further contains a color image forming substance.

6. The light-sensitive material as claimed in claim 1, wherein the light-sensitive layer further contains a color image forming substance, said color image forming substance being contained in the microcapsules.

7. The light-sensitive material as claimed in claim 1, wherein the light-sensitive layer further contains a color image forming substance, said color image forming substance comprising a color former and a color developer, one of said color former and color developer being contained in the microcapsules, and the other being arranged outside of the microcapsules.

8. The light-sensitive material as claimed in claim 1, wherein the light-sensitive layer further contains a color image forming substance, said color image forming substance comprising a color former and a color developer, said color former being contained in the microcapsules, and said color developer being arranged outside of the microcapsules.

9. The light-sensitive material as claimed in claim 1, wherein the reducing agent is contained in the microcapsules.

10. A light-sensitive material comprising a support and a light-sensitive layer containing silver halide, a reducing agent, an ethylenically unsaturated polymerizable compound, said silver halide and said ethylenically unsaturated compound being contained in microcapsules which are dispersed in the light-sensitive layer, and said ethylenic unsaturated compound being contained in microcapsules in an amount of 5 to $1.2 \times 10^5$ times by weight as much as the amount of the silver halide, wherein the light-sensitive layer is provided thereon with a protective layer.

11. The light-sensitive material as claimed in claim 10, wherein the protective layer contains a polymer having a transmission coefficient of oxygen of not more than $1.0 \times 10^{-11}$ cm$^3$·cm/cm$^2$·sec.cmHg.

12. The light-sensitive material as claimed in claim 10, wherein the protective layer is a porous layer.

13. The light-sensitive material as claimed in claim 10, wherein the cover sheet has a thickness of from 0.1 μm to 50 μm.

14. The light-sensitive material as claimed in claim 10, wherein the light-sensitive layer further contains a color image forming substance.

15. The light-sensitive material as claimed in claim 10, wherein the light-sensitive layer further contains a color image forming substance, said color image forming substance being contained in the microcapsules.

16. The light-sensitive material as claimed in claim 10, wherein the light-sensitive layer further contains a color image forming substance, said color image forming substance comprising a color former and a color developer, one of said color former and color developer being contained in the microcapsules, and the other being arranged outside of the microcapsules.

17. The light-sensitive material as claimed in claim 10, wherein the light-sensitive layer further contains a color image forming substance, said color image forming substance comprising a color former and a color developer, said color former being contained in the microcapsules, and said color developer being arranged outside of the microcapsules.

18. The light-sensitive material as claimed in claim 10, wherein the reducing agent is contained in the microcapsules.

* * * * *